(12) United States Patent
Schurman et al.

(10) Patent No.: US 9,075,098 B2
(45) Date of Patent: Jul. 7, 2015

(54) PLUG-IN ELECTRIC VEHICLE CHARGER VALIDATION AND TEST DEVICE

(71) Applicants: Thomas Michael Schurman, Woodland Hills, CA (US); Melvin G. Oster, Newbury Park, CA (US); Nathan H. Tobol, Camarillo, CA (US)

(72) Inventors: Thomas Michael Schurman, Woodland Hills, CA (US); Melvin G. Oster, Newbury Park, CA (US); Nathan H. Tobol, Camarillo, CA (US)

( * ) Notice: Subject to any disclaimer, the term of this patent is extended or adjusted under 35 U.S.C. 154(b) by 263 days.

(21) Appl. No.: 13/743,183

(22) Filed: Jan. 16, 2013

(65) Prior Publication Data

US 2014/0197843 A1    Jul. 17, 2014

(51) Int. Cl.
G01R 31/14    (2006.01)
G01R 31/02    (2006.01)
B60L 11/18    (2006.01)
G01R 31/40    (2014.01)

(52) U.S. Cl.
CPC .......... *G01R 31/025* (2013.01); *B60L 11/1824* (2013.01); *G01R 31/40* (2013.01)

(58) Field of Classification Search
CPC ... G01R 31/025; H02J 7/0027; B60L 11/1824
USPC ....................................................... 324/509
See application file for complete search history.

(56) References Cited

U.S. PATENT DOCUMENTS

| 3,946,338 | A | * | 3/1976 | Schmidt .................. 333/153 |
| 4,094,304 | A | * | 6/1978 | Wright, Jr. .............. 600/552 |
| 4,274,288 | A | * | 6/1981 | Tittmann et al. ............ 73/602 |
| 4,882,714 | A | * | 11/1989 | Tanigawa .................. 367/103 |
| 4,891,796 | A | * | 1/1990 | Sekine ....................... 367/96 |
| 5,642,052 | A | * | 6/1997 | Earle ......................... 324/556 |
| 5,818,341 | A | * | 10/1998 | Saurer et al. ............... 340/602 |
| 6,186,006 | B1 | * | 2/2001 | Schmitz et al. ............... 73/598 |
| 7,525,398 | B2 | * | 4/2009 | Nishimura et al. .......... 333/189 |
| 7,592,924 | B2 | | 9/2009 | Zhang et al. |
| 7,719,694 | B1 | * | 5/2010 | Gregoire .................... 356/601 |
| 7,931,858 | B1 | * | 4/2011 | Gross et al. .................. 422/22 |
| 8,009,276 | B1 | * | 8/2011 | Kirby et al. ................ 356/32 |
| 2009/0135183 | A1 | * | 5/2009 | Sato et al. .................. 345/426 |
| 2010/0117859 | A1 | * | 5/2010 | Mitchell et al. ......... 340/870.16 |
| 2012/0022811 | A1 | | 1/2012 | Dickinson et al. |
| 2012/0025842 | A1 | | 2/2012 | Gibbs et al. |
| 2012/0025844 | A1 | | 2/2012 | Morita |
| 2012/0257314 | A1 | * | 10/2012 | Armstrong .................. 361/42 |
| 2014/0241112 | A1 | * | 8/2014 | Kano ........................... 367/7 |

* cited by examiner

*Primary Examiner* — Benjamin M Baldridge

(57) ABSTRACT

A process and apparatus for performing a ground fault test of a device is disclosed. A current level may be selected from a plurality of predetermined current levels. A ground fault current may be generated between a first power line and a ground at the selected current level until a ground fault interrupter within the device trips, or until expiration of an on-time period associated with the selected current level. The ground fault current may then be set to zero for an off-time period associated with the selected current level. The process may be repeated for each of the plurality of current levels. When the ground fault interrupter within the device trips, the current level and a time interval from an onset of the ground fault current at the selected level and a time when the ground fault interrupter tripped may be recorded.

11 Claims, 11 Drawing Sheets

PLUG-IN ELECTRIC VEHICLE CHARGER VALIDATION AND TEST DEVICE

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile by anyone of the patent disclosure as it appears in the Patent and Trademark Office patent files or records, but otherwise reserves all copyright and trade dress rights whatsoever.

BACKGROUND

1. Field

This disclosure relates to test equipment for verifying performance of electric vehicle charging equipment.

2. Description of the Related Art

The Electric Vehicle Initiative has set a goal of 20 million electric vehicles on the road worldwide in 2020. In this patent, the term "plug-in electric vehicle", or PEV, includes both battery-only electric vehicles and plug-in hybrid electric vehicles. Each of these vehicles will require access to a charging system to recharge the on-board battery. Electric Vehicle charging systems are termed Electric Vehicle Supply Equipment (EVSE), and sometimes referred to as an EV Charge Point (i.e. a location or point on a map where an electric vehicle may be recharged).

The global installed base of EVSEs may exceed, or soon will exceed, the number of electric vehicles. A large portion of these EVSEs are individual units installed in a vehicle-owner's home prior to taking delivery of the vehicle. Additional EVSE units are installed in commercial and industrial locations such as shopping malls, government facilities, business parks, and curbside in many municipalities that offer street parking.

The Society of Automotive Engineers (SAE) has defined an industry standard, SAE J1772™, that defines the charge coupler and electrical interfaces for 120V and 240V AC charging of a plug-in electric vehicle. This document also defines safety-related requirements on EVSEs including proximity detection contacts that tell both the EVSE and the PEV that the connector is connected properly and safely, electric signaling between the EVSE and the PEV to ensure the current drawn does not exceed either the installed circuit or the PEV's capabilities; and detection of ground faults and missing ground connections. IEC 61851-1 is similar specification covering EVSEs for use in Europe. Underwriters Laboratories has defined another industry standard, UL2231, to specify safety requirements for EVSEs.

Throughout this description, elements appearing in figures are assigned three-digit reference designators, where the most significant digit is the figure number where the element is introduced and the two least significant digits are specific to the element. An element that is not described in conjunction with a figure may be presumed to have the same characteristics and function as a previously-described element having the same reference designator.

DETAILED DESCRIPTION

Description of Apparatus

Figure 1:
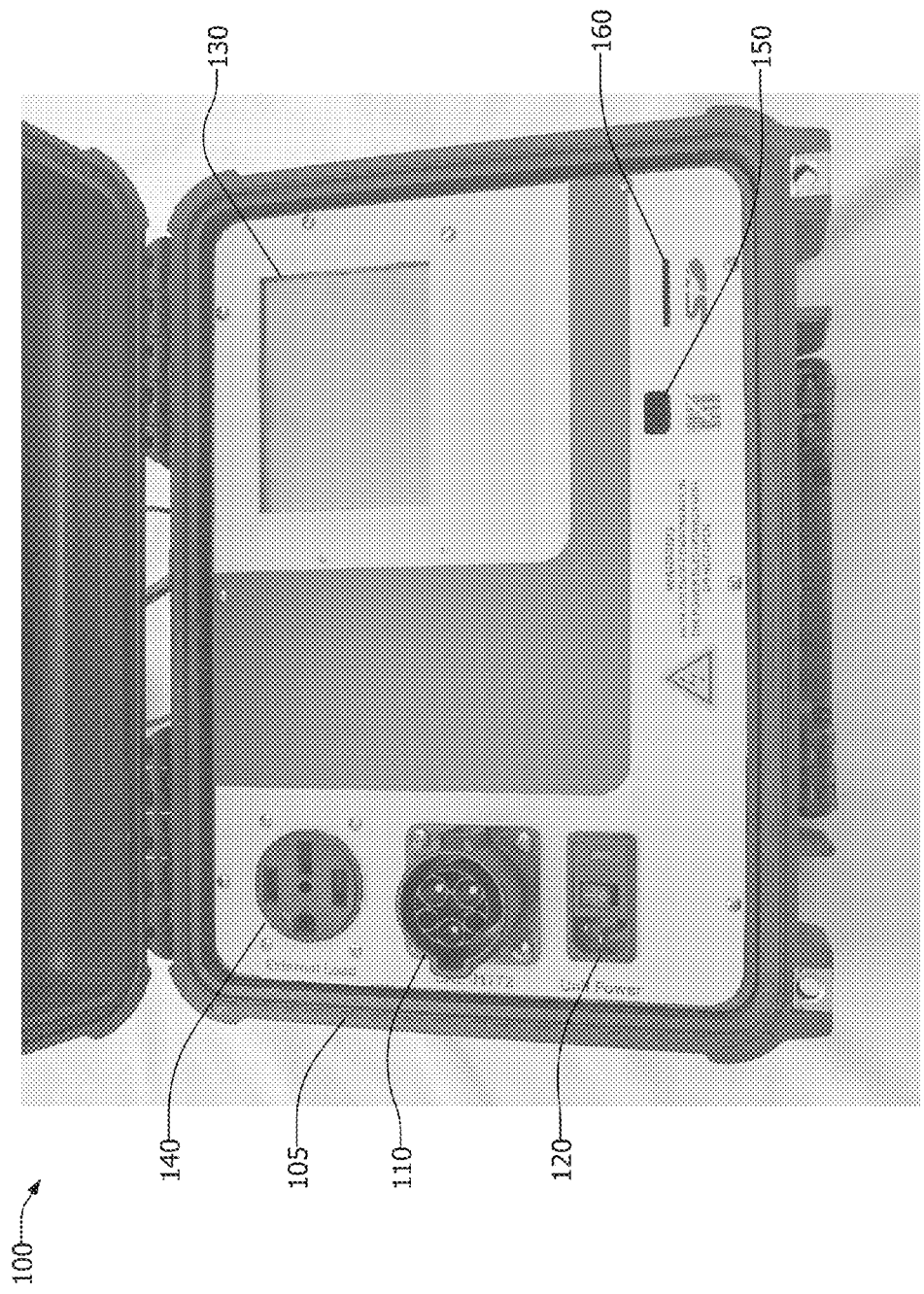
FIG. 1 is a photograph of a prototype electric vehicle emulator (EVE).

FIG. 1 is a photograph of a prototype EVE 100. Key elements of the EVE 100 may include one or more connectors 110 for connection to a cable from the EVSE, a conventional AC inlet 120 with power switch, and a touch-screen display 130. The EVE 100 may also include a connector 140, such as a NEMA outlet, for connecting an external load; a connector 150 to interface with a hand-held bar-code reader; and/or a connector or slot 160 for a removable memory device, such as secure digital (SD) card or a USB memory.

The EVE 100 may be packaged in a portable enclosure 105 suitable for use by a electrician or other person installing an EVSE. Other versions of the EVE intended for use in laboratory or manufacturing environments may be packaged differently.

In the U.S., the connector 110 may be an SAE J1772™ inlet, as shown in FIG. 1 (an optional dust cover is not shown). Other countries may require other types of connectors, which may be provided on the EVE 100 in addition to, or instead of, the SAE J1772™ inlet.

The touch-screen display 130 may include a color or black-and-white flat panel display, such as a liquid crystal display or a light emitting diode display, and a touch panel. The touch panel may be configured for operation by a user wearing gloves. The touch-screen display 130 may present a graphical user interface (GUI). For example, the GUI may include about 3-5 main screens for operation of the unit, additional screens as needed for advanced configuration of the unit, welcome/loading screens, help screens, version information ("About") screen, and other screens. Various input data, such as the identification of the EVSE, may be entered using the GUI at the beginning of a test session. Interim and final test results may be displayed on the touch-screen display 130 during and after a test session.

Figure 2:
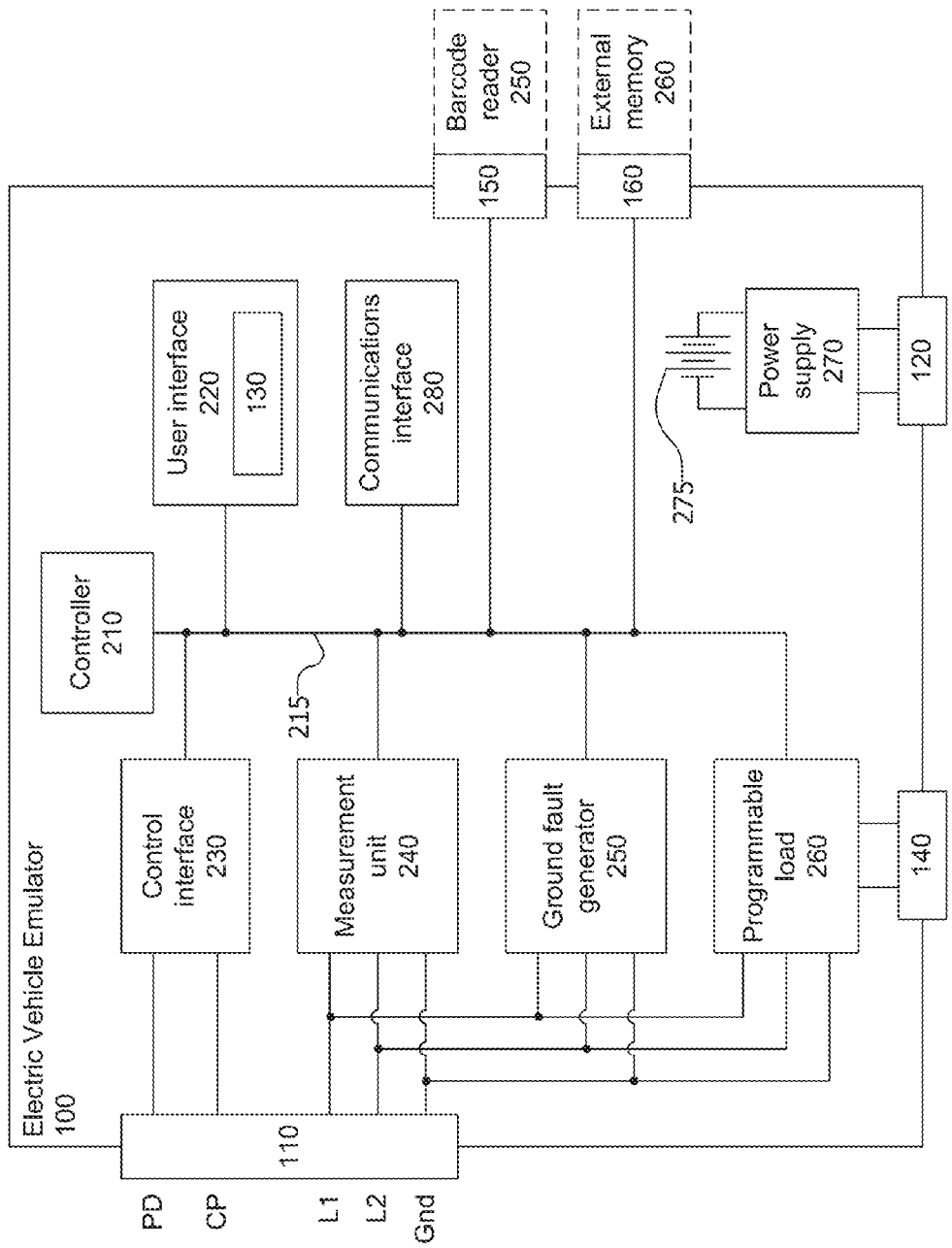
FIG. 2 is a block diagram of an EVE.

Referring now to FIG. 2, the EVE 100 may include a control interface 230, a measurement unit 240, a ground fault generator 250, and a programmable load 260 coupled to the EVSE connector 110. A controller 210 may be coupled to each of the control interface 230, the measurement unit 240, the ground fault generator 250, and the programmable load 260. The programmable load 260 may be connectable to an external load via the connector 140. The controller 210 may also be coupled to a user interface 220, a barcode reader 250 via the connector 150, an external memory 260 via the connector 160, and a communications interface 280.

The EVSE connector 110 may include a proximity detect (PD) contact, a control pilot (CP) contact, two power line contacts L1/L2 to receive single-phase AC power, and a ground contact. In some countries, including at least portions of Europe, PEVs may receive three-phase AC power from EVSEs. In this case, the EVSE connector 110 may include a third power line contact L3 (not shown). The EVSE connector 110 may also include positive and negative contacts (not shown) for high voltage direct current charging in addition to, or instead of, the L1/L2 power line contracts.

The proximity detect contact is normally connected via a resistor or other circuit to the ground contact within the plug at the end of the cable from the EVSE. The connection between the PD contact and the ground contact is used by a PEV to sense that an EVSE cable has been connected to the PEV. The CP contact is normally connected to the ground contact via a resistor within the PEV. The EVSE senses the presence of the resistance between the CP contact and ground to determine that the EVSE cable has been connected to a vehicle.

The control interface 230 may contain circuitry to sense the presence of the proximity detect pin mated with the PD contact of the connector 110, and thus detect engagement of a cable from an EVSE. The control interface 230 may also include circuitry to measure the voltage, frequency, and duty factor of the signal supplied by the EVSE to the CP contact. The control interface 230 may report these measurements to the controller 210. The control interface 230 may make these measurements in collaboration with the controller 210. For example, the control interface 230 may digitize the signal supplied on the CP contact and provide the digitized signal to the controller 210. The controller 210 may then determine the frequency and duty cycle of the signal. The control interface 230 may also include circuitry to change the resistance from the CP contact to ground in response to commands from the controller 210 in order to initiate changes in the EVSE state. The EVSE states will be further described in the subsequent Description of Processes portion of this patent.

The measurement unit 240 may measure the voltage and/or the current supplied on the AC power input lines (L1, L2 and L3 and/or DC power lines where present) and the ground. The measurement unit 240 may also be capable of other measurements such as, for example, measuring the resistance from individual contacts (L1, L2, CP, etc.) of the EVSE connector 110 to ground. The measurement unit 240 may include one or more AC/DC converters and one or more current sensing resistors. The measurement unit 240 may provide digitized values for the voltage and current on the AC line and ground to the controller 210. The measurement unit 240, in cooperation with the controller 210, may determine if the voltage and current on the AC line and ground are consistent with expected values.

The ground fault generator 250 may, in response to commands from the controller 210, introduce a programmable ground fault current from one or both of the L1 and L2 lines to ground. For example, the magnitude of the ground fault current may be increased in gradual steps until the EVSE detects the ground fault. The magnitude of the ground fault current at the point the EVSE detects the ground fault, and the time required for the EVSE to react to the ground fault, may then be compared to the specification for the EVSE. Ground fault testing will be further described in the Description of Processes.

The programmable load 260 may, in response to commands from the controller 210, cause a programmable current to flow between the L1 and L2 lines. The programmable load 260 may be coupled to the connector 140 for attachment of an external load. In the absence of the external load, the programmable load 260 may cause a programmable current, which may be less than or equal to the rated maximum current of the EVSE, to flow between the L1 and L2 lines. Optionally, an external load may be attached to the EVE 100 such that the total current flowing through the programmable internal load and the external load may be set equal to the expected maximum current capacity of the EVSE.

The user interface 220 may include the touch screen display 130, or a display without a touch screen, and various switches and controls necessary to perform the tests and functions described herein.

While the EVE 100 may commonly be used in conjunction with the barcode reader 250 and the external memory 260, the barcode reader 250 and the external memory 260 are not part of the EVE. The barcode reader 250 may be, for example, a detachable hand-held reader for reading the identification of the EVSE. The external memory 260 may be, for example a USB "thumb drive", an SD card, an external disk drive, or some other removable memory device coupled to the EVE 100 via the connector 160. The controller 210 may retrieve test procedures, specifications, and software upgrades from the external memory 260. The controller 210 may store test results and test reports to the external memory device 260.

The communications interface 280 may include interfaces to one or more wired or wireless networks. The communications interface 280 may include, for example, one or more of an Ethernet™ interface for connection to a wired network, a power line communications modem for communications with the EVSE via one or more of power lines L1, L2 connecting the EVSE and the EVE 100, a Blue Tooth™ transceiver, a Zigbee™ transceiver, a WiFi™ transceiver, and/or a transceiver for some other wireless communications protocol. The communication interface 280 may be used to connect the EVE 100 to a network, which may be or include the Internet. For example, the EVE may be connected to the network for purposes of downloading software, firmware, test procedures and/or for reporting test results. The communications interface 280 may be use to connect the EVE to an EVSE or smart utility meter similarly equipped with a wireless transceiver or a power line communications modem. The communications interface 280 may be used, in lieu of the connector 150, to connect the EVE 100 to a wireless bar code reader. The communications interface 280 may be used to connect the EVE to a computing device such as a portable computer, a tablet computer, or a smart phone. The EVE may be connected to a computing device, for example, to allow manual control of the EVE via the computing device or to use the computing device to display digitized waveforms captured by the EVE.

The components of the EVE 100 may operate from power provided by an internal power supply 270. The power supply 270 may receive conventional 110 volt AC power via the connector 140. The power supply 270 may also serve as a charger for an internal battery 275. The battery 275 may provide power to the components of the EVE 200 when AC power is unavailable.

The controller 210 may include hardware, firmware, and software for providing functionality and features described herein. The hardware and software and their functions may be distributed such that some components are performed by the controller 210 and others by components of the EVE 100.

The controller 210 may be coupled to other components of the EVE via one or more bus 215. The one or more bus 215 may include both parallel buses, such as a PCI™ (peripheral component interconnect) bus, and/or serial busses, such as USB™ (Universal Serial Bus), I2C™ (Inter-Integrated Circuit), RS232C, or SPI (Serial Peripheral Interface) busses. The controller 210 may be coupled to one or more components of the EVE 100 by dedicated connections.

Figure 3:
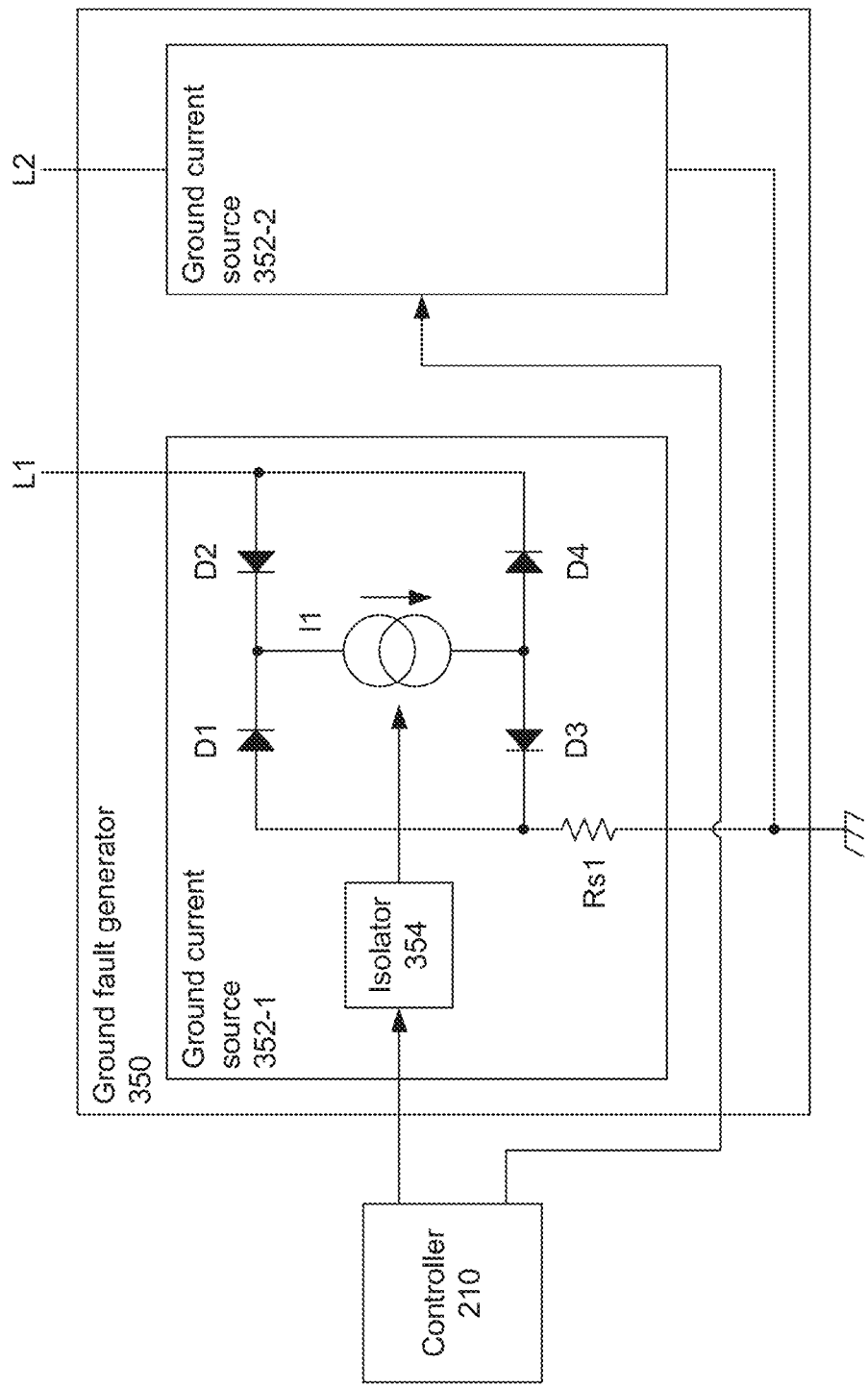
FIG. 3 is a block diagram of a programmable ground fault generator.

Referring now to FIG. 3, a ground fault generator 350, which may be suitable for use as the ground fault generator 250, may include a first ground current source 352-1 and a second ground current source 352-2. The first ground current source 352-1 and the second ground current source 352-2 may be connected between ground and the L1 and L2 power inputs to the EVE, respectively. An EVE that receives addition power inputs (e.g. a third AC power phase and/or DC power inputs) may include additional ground current sources. The elements of the second ground current source 352-2, which may be identical to the elements of the first ground current source 352-1, will not be separately described. Alternatively, a ground fault generator may include a single ground current source, such as the first ground current source 352-1, and a switching mechanism to selectively connect the single ground current source to different power lines.

The first ground current source 352-1 may include a bridge rectifier formed by diodes D1, D2, D3, and D4. A controlled DC current source I1 may be coupled to the bridge rectifier such that a DC current generated by the DC current source is converted into an AC current flowing between L1 and ground. Circuits for a controlled DC current source are known to persons of skill in the art of power electronics. The controlled DC current source I1 may be controlled by the controller 210 via an isolator 354. The isolator 354 may be an optical isolator, a transformer, or some other circuit to couple a control signal from the controller 210 to the controlled current source 354 while maintaining DC isolation.

The signal coupled from the controller 210 to the controlled current source I1 may be an analog signal. In this case, the controlled current source I1 may, for example, generate a current proportional to the analog signal.

The signal coupled from the controller 210 to the controlled current source I1 may be a digital signal. For example, the controller 210 and the controlled current source may be connected by an isolated I2C™ bus. In this case, the controlled current source I1 may include a digital-to-analog converter to convert the digital value to a DC level and then generate a current proportional to the DC level.

The signal coupled from the controller 210 to the controlled current source I1 may be a pulse-width modulated signal. Pulse width modulated signals are commonly used to allow a processor to control an analog function, such as a fan motor speed. In this case, the controlled current source I1 may include a low pass filter to convert the pulse width modulated signal to a DC voltage level and then generate a current proportional to the DC voltage level.

The controller 210 may provide an open loop control signal to the controlled current source I1. Alternatively, the controller 210 may provide closed-loop control of the current generated by the controlled current source IL In this case, the controller 210 may receive feedback indicative of the current generated by the controlled current source I1. The feedback may be, for example, a voltage across a current sensing resistor Rs1.

Figure 4:
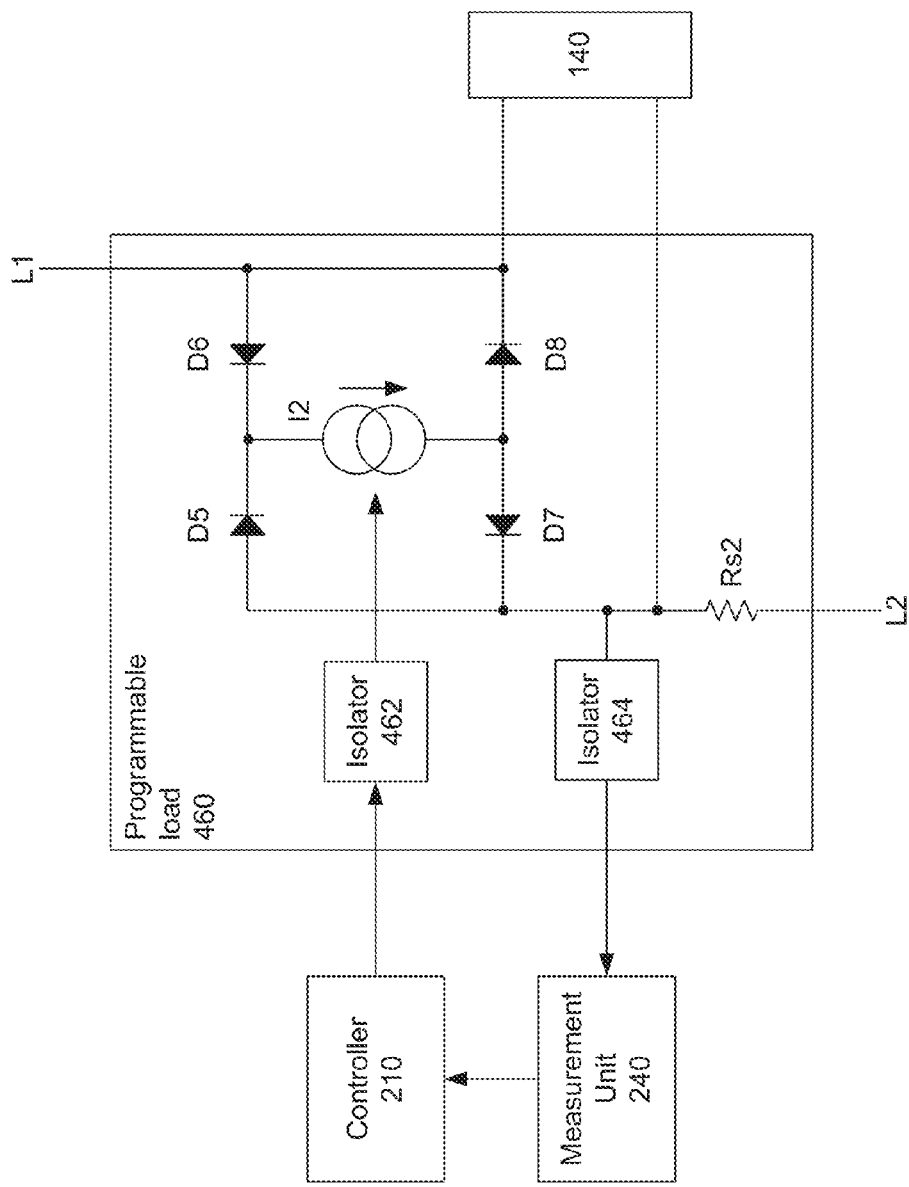
FIG. 4 is a block diagram of a programmable load.

Referring now to FIG. 4, a programmable load 460, which may be suitable for use as the programmable load 260, may include a bridge rectifier formed by diodes D5, D6, D7, and D8. A controlled DC current source I2 may be coupled to the bridge rectifier such that a DC current generated by the DC current source is converted into an AC current flowing between L1 and L2. Circuits for a controlled DC current source are known to persons of skill in the art of power electronics. The controlled DC current source I2 may be controlled by the controller 210 via an isolator 462. The isolator 462 may be an optical isolator, a transformer, or some other circuit to couple a control signal from the controller 210 to the controlled current source I2 while maintaining DC isolation.

The signal coupled from the controller 210 to the controlled current source I2 may be an analog signal, a digital signal, or a pulse-width modulated signal as previously described.

The controller 210 may provide an open loop control signal to the controlled current source I2. Alternatively, the controller 210 may provide closed-loop control of the current generated by the controlled current source I2. In this case, the controller 210 may receive feedback indicative of the current generated by the controlled current source I2, such as, for example, a voltage across a current sensing resistor Rs2. The voltage across the sensing resistor Rs2 may be coupled to the measurement unit 240 via a second optical isolator 464.

The external load connector 140 may be connected in parallel with the bridge rectifier, allowing an external resistor bank or other external load to be connected in parallel with the load current generated by the internal controlled current source I2.

Figure 5:
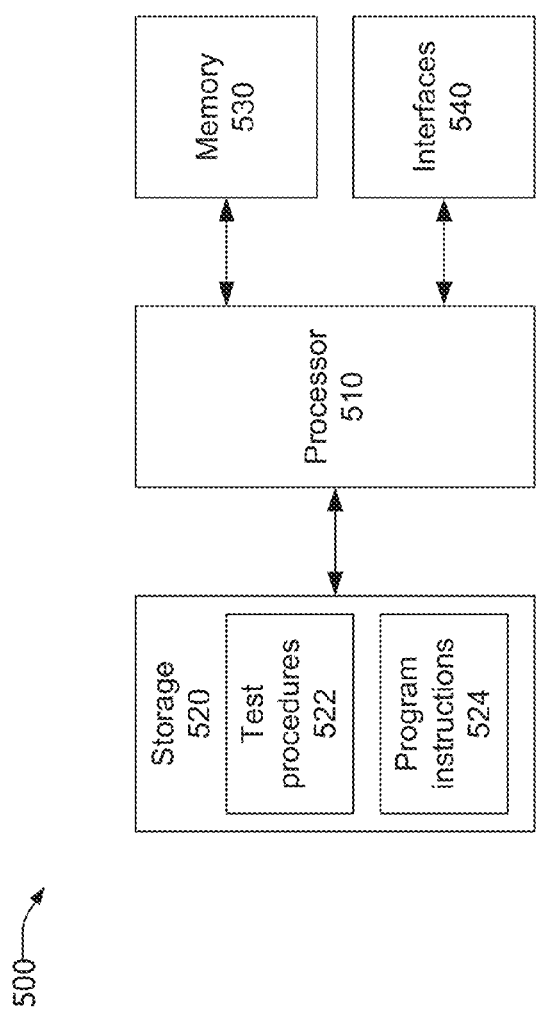
FIG. 5 is a block diagram of a controller.

Referring now to FIG. 5, a controller 500, which may be suitable for use as the controller 210, may include a processor 510 coupled to storage 520, memory 530 and one or more interfaces 540. The processor 510 may include hardware, which may be augmented by firmware, for providing functionality and features described herein. The processor 510 may include one or more processor circuits such as microprocessors, digital signal processors, and graphic processors. The processor 510 may include other circuits such as logic arrays, analog circuits, and/or digital circuits.

The storage 520 may include one or more storage devices. As used herein, a "storage device" is a device that allows for reading and/or writing to a storage medium. These storage media include, for example, magnetic media such as hard disks, optical media such as compact disks (CD-ROM and CD-RW) and digital versatile disks (DVD and DVD±RW); flash memory devices; and other storage media. As used herein, the term "storage media" means a physical object for storing information. The term storage media does not encompass transitory media such as signals and waveforms.

Information stored in the storage 520 may include one or more test procedures 522. Each stored test procedure may define a test or sequence of tests to be performed on an EVSE. Stored test procedures may include, for example, a default test for each of one or more classes of EVSE (e.g. AC Level I, AC Level II, DC as defined in SAE J1772™) Default test procedures may be designed to verify that the EVSE under test conforms to standards set by the SAE, the UL, or other standard-setting authority. Stored test procedures may include one or more type-specific test procedures, each intended to test a specific model of EVSE or an EVSE made by a specific manufacturer. Each type-specific test procedure may contain test methods, test parameters, and pass-fail criteria specified by the manufacturer of the corresponding EVSE.

Information stored in the storage 520 may include program instructions 524 for execution by the processor 510. The program instructions 524 may be in the form of an application program, an applet (e.g., a Java applet), a browser plug-in, a COM object, a dynamic linked library (DLL), a script, or one or more subroutines. The program instructions 524 may include an operating system such as, for example, variations of the Linux, Microsoft Windows®, Symbian®, Android®, and Apple® operating systems.

The memory 530 may include static or dynamic random access memory, read-only memory, and/or nonvolatile memory such as flash memory. Information stored in the memory may include a BIOS (basic input/output system) to initialize the processor 510, interim and final test data, and other data relating to ongoing operation of the processor 510. All or portions of the test procedures 522 and/or program instructions 524 may be temporarily copied into the memory 530 for faster execution.

The interfaces 540 may include specialized circuits required to interface the controller 500 with the other elements of an EVE. The interfaces may include parallel buses, such as a PCI™ (peripheral component interconnect) bus, serial busses, such as USB™ (Universal Serial Bus), I2C™ (Inter-Integrated Circuit), RS232C, or SPI (Serial Peripheral Interface) busses, and/or dedicated connections to one or more components of the EVE.

Description of Processes

Figure 6:
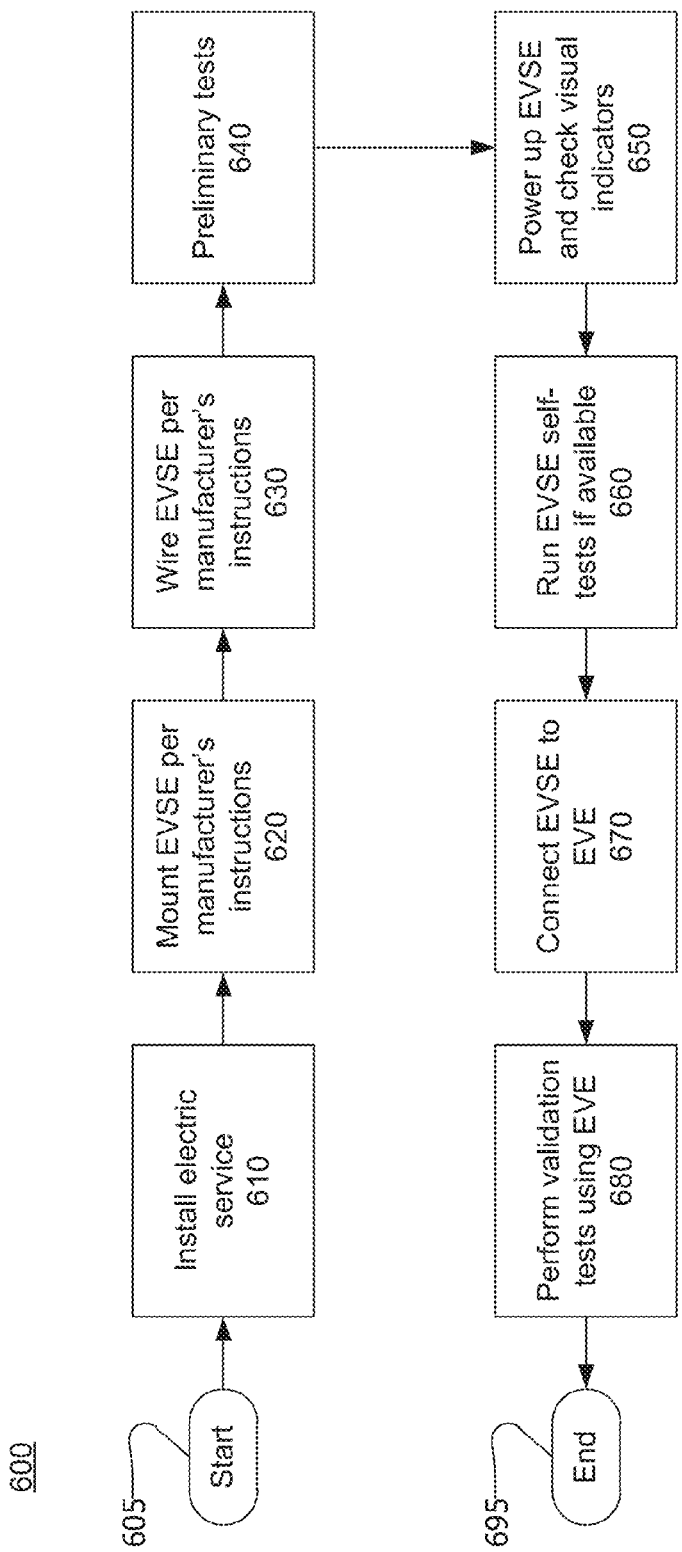
FIG. 6 is a flow chart of a process for installing an EVSE.

FIG. 6 is a flow chart of a process 600 for installing an EVSE at a customer premise. The process 600 may commonly be performed by a licensed electrician, an electrical contractor, or an employee of the EVSE manufacturer, all of whom will be referred to herein as "the electrician". The process 600 may start at 605, after the customer has selected and purchased an EVSE, which may be, for example, an EVSE recommended by the manufacturer of the PEV the customer has purchased or intends to purchase.

At 610, the electrician may install electric service to the location of the EVSE. Installing the electric service may include installing one or more of a dedicated breaker, a wiring circuit, and an outlet for the EVSE. For example, the electric service for an AC Level II EVSE will typically be 240 volts at a current rating about 40 amps.

At 620, the electrician may mount the EVSE on a wall or pedestal in accordance with the EVSE manufacturer's instructions and customer preferences.

At 630, the electrician may connect the EVSE to the electric service installed at 610. At 640, the electrician may perform preliminary checks and tests to validate the circuit leading to the EVSE is wired properly, and that the ground connection to the EVSE is valid and safe.

At 650 the Electrician may power-on the EVSE and check any available visual indicators (e.g. indicator lights, displays, etc.) for apparent proper operation of the EVSE. At 660, the EVSE, when first powered, may perform self-diagnostic tests to ensure the EVSE unit is receiving power and operating as expected.

At this point in the process 600, the electrician will want to validate that the EVSE can deliver power to an electric vehicle. The problem, however, is that a PEV is typically not present at this point in the process 600. For example, some electric manufacturers require that an EVSE be installed in a customer's home prior to that customer taking delivery of the PEV. Without a means to test the output of the EVSE, the Electrician cannot know with complete certainty that the EVSE is functional and that the installation process was performed properly.

Thus, at 670, the electrician may connect the EVSE to an EVE such as the EVE 100. At 680, the electrician may use the EVE to perform a series of tests on the EVSE using the EVE to emulate a PEV. The process 600 may end at 695 after completion of the tests.

Figure 7:
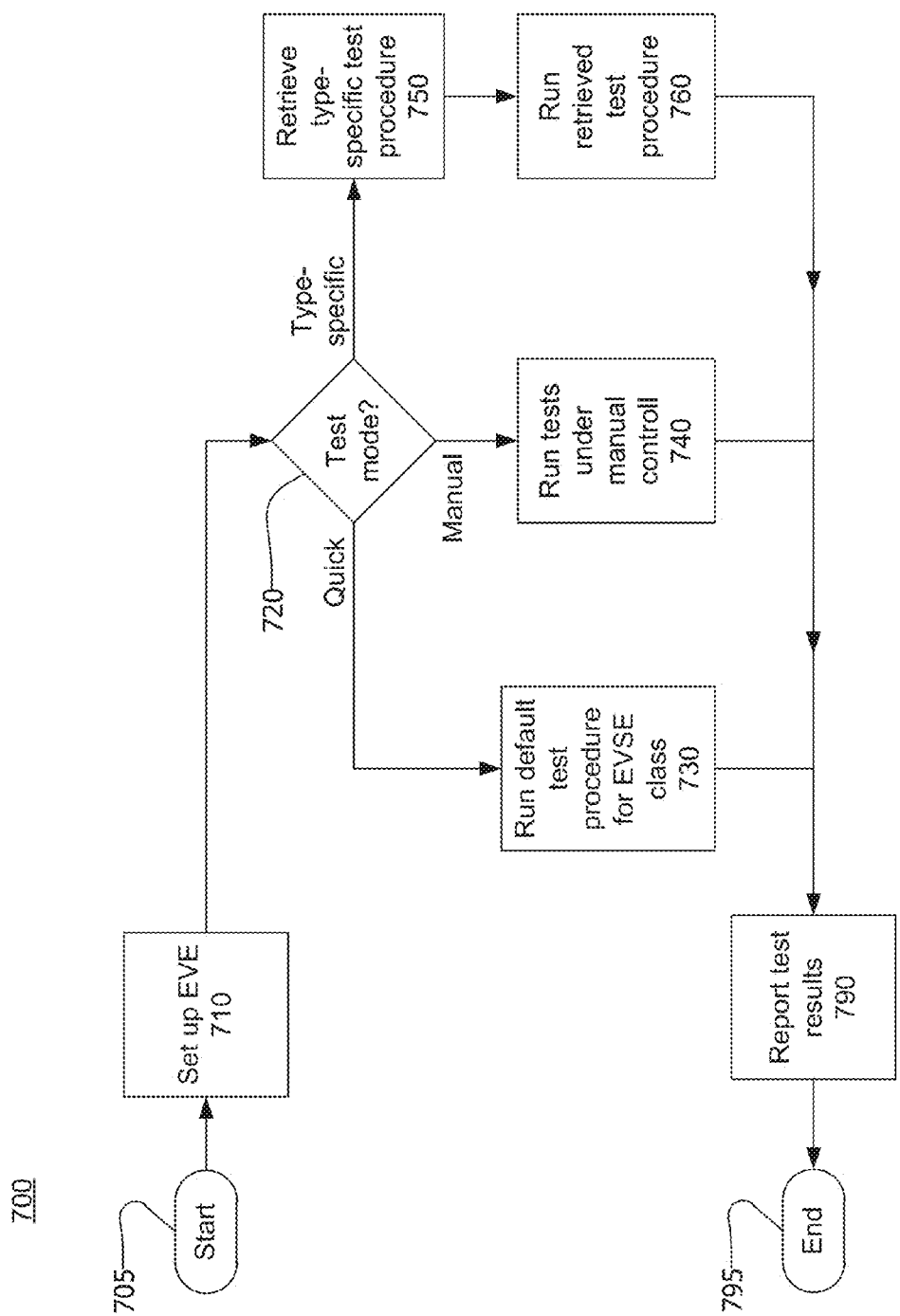
FIG. 7 is a flow chart of a process using an EVE to test an EVSE.

FIG. 7 is a flow chart of a process 700 for testing an EVSE with an EVE. The process 700 may be suitable for use at 680 in the process 600. The process 700 may start at 705 when the EVE is connected to the EVSE. The process 700 may end at 795 after results of the test have been reported.

At 710, the electrician may set up the EVE to test the EVSE. Setting up the EVE may include determining the unique identity of the EVSE. The identity of the EVSE may be determined, for example, by a using a bar code reader to read a bar code affixed to the EVSE, by reading an RFID tag affixed to the EVSE, by direct communications between the EVE and the EVSE, or by the electrician manually entering identifying information into the EVE using, for example, a touch screen display. The identity of the EVSE may include, for example, a manufacturer, a model number, a serial number, and a class. Currently, SAE J1772™ defines the class of the EVSE to be either AC Level I (120 volts) or AC Level II (240 volts). In the future, higher voltage DC fast chargers will also be available. Setting up the EVE may also include entering other information such as the owner's name and/or the address where the EVSE is located.

The EVE may offer a plurality of test modes that may be selected, for example, by operation of a physical control or a virtual control (i.e. a control displayed on a touch-screen display). The EVE may offer a quick test mode that allows the electrician to quickly select a default test procedure appropriate for the class of the EVSE under test. The EVE may offer a manual test mode in which each test is initiated and controlled by the electrician. The EVE may store one or more type-specific test procedures. A type-specific test procedure may be intended to test a specific model of EVSE or an EVSE made by a specific manufacturer. A type-specific test procedure may be intended to emulate a particular model or type of electric vehicle. Each type-specific test procedure may contain test methods, test parameters, and pass-fail criteria specified by the manufacturer of the corresponding EVSE.

At 720, the EVE test mode selected by the electrician may be determined. If the quick test mode has been selected, a default test procedure may be run at 730. The default test procedure may be appropriate to the class of the EVSE (AC Level I, AC LEVEL II, etc.). The status of the test and interim test results may be displayed on a display of the EVE as the test procedure is run at 730.

If the manual mode has been selected, one or more tests may be performed at 740 under manual control. The result of each test may be displayed on the display of the EVE and/or stored for subsequent reporting.

When the type-specific mode has been selected, a test procedure for the EVSE under test may be retrieved from storage within the EVE at 750 and run at 760. If a type-specific test procedure for the EVSE under test is not stored in the EVE, the test procedure may revert to the default procedure used at 730 in the quick test mode.

After a test procedure has been completed at 730, 740, or 760, test results may be reported at 790. Reporting the test results at 790 may include displaying all or portions of the test results on a display of the EVE and saving all or portions of the test results in internal memory and/or a removal external memory device coupled to the EVE. Reporting the test results at 790 may also include transmitting all or portions of the test results to a remote device via a network. After the test results are reported, the process 700 may end at 795.

Figure 8:
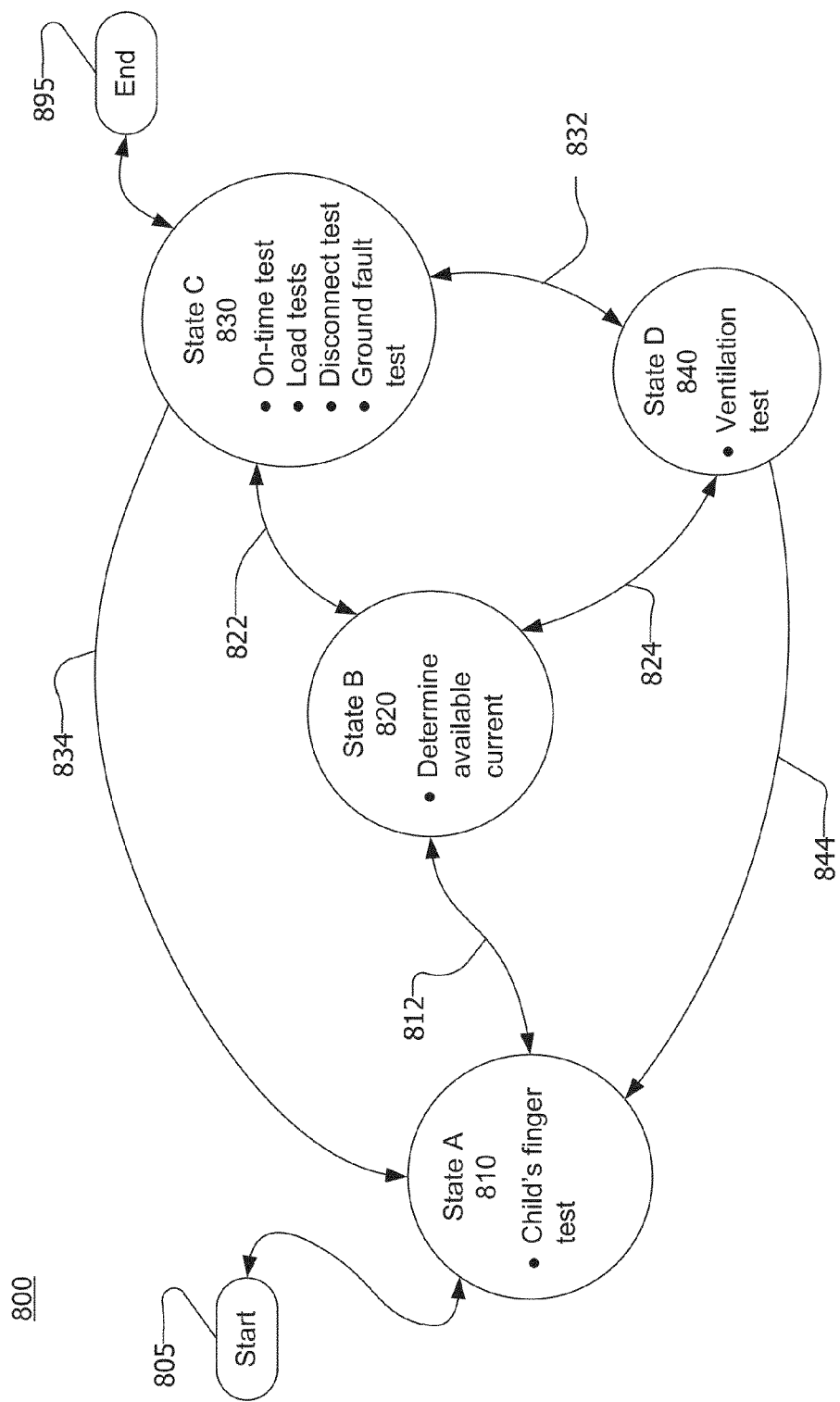
FIG. 8 is a flow chart of a test procedure.

Referring now to FIG. 8, an exemplary test procedure 800 may be representative of test procedures performed at 730 or 760 in the process 700. The test procedure 800 assumes that the EVSE under test conforms to SAE J1772™. Similar test procedures may be performed to test EVSEs that conform to other specifications.

The test procedure 800 may include stepping the EVSE through a series of states defined in SAE J1772™. In accordance with this specification, transitions between the states are initiated by the EVE by varying a resistive load upon the control pilot pin of the J1772 receptacle. Changing the resistive load in turn changes the voltage of a signal supplied by the EVSE to the control pilot pin. The voltage change is sensed by the EVSE to cause a corresponding state change. In each state, the EVE may make appropriate measurements.

The test procedure 800 may begin at 805, when the EVSE is connected to the EVE and power is applied to the EVSE. The test procedure 800 may end at 895 after all tests have been performed. In the situation where the EVSE fails one or more tests, the test procedure 800 may be terminated at the point of failure or may continue to completion.

When the EVE is initially connected to the EVSE, the EVSE may be in State A at 810. State A, as defined by SAE J1772™, normally occurs when the EVSE is disconnected from a vehicle. In State A, the EVSE should provide a 12 volt DC level (with respect to ground) on the control pilot contact, and should not provide any voltage or current on either line contact. However, the EVE cannot measure any characteristics of the EVSE unless the J1772 plug is engaged with the EVE. Thus, at 810, the CP contact (which is normally connected to ground via a resistor in a PEV) within the EVE may be an essentially open circuit, such that the EVSE is unaware that it is connected to the EVE. In this condition, the EVE may measure the voltage (nominally 12 volts DC) provided by the EVSE on the CP pin. The EVE may also measure voltages on the other pins of the J1772 receptacle to confirm that the EVSE does not provide a charging voltage while in State A.

At 810, a so-called "child's finger test" may be performed. This test may simulate a child or other person handling the J1772 outlet plug attached to the EVSE and touching one or more of the contacts in the plug. This test may be performed, for example, by connecting a high value resistor between pairs of contacts in the J1772 receptacle. To pass this test, the EVSE must not interpret the high value resistor as a connection to an EVE and must not provide any hazardous voltage at any pin of the J1772 outlet plug.

After measuring the open-circuit voltage at the CP pin and/or performing the child's finger test at 810, the EVE may initiate a transition 812 from State A to State B. State B, as defined by SAE J1772™, occurs when the EVSE is connected to a vehicle but not delivering charging power. To initiate the transition from State A to State B, an electric vehicle connects a resistance, nominally 2700 ohms, from the CP pin to ground, causing the DC voltage at the CP pin to drop to 9±1 volts. The EVSE, upon sensing the drop in voltage, should enter State B at 820. At 812, the EVE may test that the EVSE conforms to the specification by repeatedly causing the EVSE to transition from State A to State B, using different resistance values. The EVE may cause the DC voltage at the CP pin to drop to different voltage values spanning to range of 9±1 volts (e.g. 8.0, 8.5, 9.0, 9.5, and 10.0 volts) to confirm that the EVSE properly transitions from State A to State B.

At 820, when the EVSE assumes State B, the EVSE should output a pulse width modulated control pilot signal on the CP pin. The CP signal switches between ground and 9±1 volts (as determined by the resistor connected to ground within the EVE) at a nominal frequency of 1000 Hz. In accordance with SAE J1772™, the duty cycle of the CP signal indicates the amount of charging current available from the EVSE. At 820, the EVE may measure the voltage, frequency, and duty cycle of the CP signal. The EVE may also measure the voltage and current at the L1 and L2 pins. The expected result is that the voltage and current on the L1 and L2 contacts will be zero. Any deviation from the expected values may be interpreted as a failure of the EVSE.

At 820, the EVE may determine the available current based on the duty cycle of the CP signal. The available current may be displayed to the electrician, who may confirm that the available current indicated by the EVSE is consistent with the electrical service provided to the EVSE and the type of the EVSE. Alternatively, the EVE may request, before or during the test procedure, that the electrician enter the expected available current for the EVSE.

After the available current is determined and verified at 820, the EVE may initiate a transition 822 from State B to State C. State C, as defined by SAE J1772™, occurs when the EVSE is delivering charging power to a vehicle without requiring external ventilation. To initiate the transition from State B to State C, an electric vehicle may lower the resistance connect from the CP pin to ground, causing the maximum voltage of the CP signal to drop to 6±1 volts. The EVSE, upon sensing the drop in voltage, should enter State C. The EVSE, upon sensing the lower CP signal voltage, is required by SAE J1772™ to initiate AC energy transfer within 3 seconds.

At 822, the EVE may test that the EVSE conforms to the specification by repeatedly causing the EVSE to transition from State B to State C, using different resistance values. The EVE may cause the DC voltage at the CP pin to drop to different voltage values spanning to range of 6±1 volts (e.g. 5.0, 5.5, 6.0, 6.5, and 7.0 volts) to confirm that the EVSE properly transitions from State B to State C.

Initially at 830, the EVE may conduct an "on-time" test to verify that the EVSE responds to the transition 822 within the specified time period. The EVE may measure the voltage present at the L1 and L2 contacts and validate that the expected charging voltage (120 volts for a Level I EVSE, 240 volts for a Level II EVSE, or some other expected voltage) is present within a predetermined time, such as 3 seconds, of initiating the transition 822. The EVE may measure and record the actual time required to initiate energy transfer after initiation of the transition 822.

Another test that may be performed or initiated at 830 with the EVSE in State C may be a disconnect test. A disconnect test may be performed by disconnecting or opening the resistance applied between the control pilot contact and ground. Disconnecting the resistance will cause the maximum voltage of the control pilot signal to increase to 12 volts. The EVSE should interpret the increase in voltage as a disconnection of the cable between the EVSE and a PEV. In response, the EVSE should immediately execute transition 834 to State A and stop providing the charging voltage at the L1 and L2 contacts within 100 milliseconds. Additionally, the EVSE must discontinue the pulse width modulated signal on the pilot line contact in less than two seconds.

The EVE may emulate transition from each of States B, C, and D to State A to the charging voltage is discontinued as expected, and that the pilot oscillator terminates as expected. During the disconnect test, the EVE may measure the voltage on the L1 and L2 contacts and monitor the control pilot signal and record the actual time required for the L1 and L2 voltages to return to zero, and the time required to discontinue the control pilot signal after initiation of the transition 834. After completion of the disconnect test, the EVE may initiate the transition 812 to State B and then the transition 822 to return the EVSE to State C.

SAE J1772™ requires that a PEV initiate a transition back to State B at the end of each charging activity, typically when the vehicle has completed recharging its internal battery. The PEV signals this to the EVSE by raising the resistance from the pilot pin to ground, thus returning the pilot voltage to 9±1 volts. In response, the EVSE is required by SAE J1772™ to terminate charging current flow within 3 seconds upon transition to State B. At 830, the EVE may initiate the transition 822 from State C to State B. The EVE may measure the voltage on the L1 and L2 contacts and record the actual time required for the L1 and L2 voltages to return to zero after the transition was initiated. The EVE may again initiate the transition 822 to return the EVSE to State C.

Other tests that may be performed at 830 include load tests and a ground fault test, which will be described in more detail subsequently.

Some electric vehicles cannot be safely charged within an enclosed space without ventilation. SAE J1772™ defines State D of the EVSE to be essentially the same as State C except that the PEV being charged requires ventilation. An EVSE located outdoors may operate identically in State C and State D, since ventilation is inherent in an outdoor location. A PEV located indoors may respond to a request for State D by initiating ventilation (i.e. a fan or blower) if available. A PEV located indoors may respond to a request for State D by discontinuing charging if ventilation is not available.

In the process 800, the EVE may optionally initiate a transition 832 from State C to State D 840 by further lowering the resistance connected from the control pilot contact to ground to reduce the maximum voltage of the control pilot signal to 3±1 volts. Alternately or additionally, the EVE may initiate a transition 824 directly from State B to State D. The EVE may then verify that the EVSE has responded appropriately. Since the EVE may not be able to directly determine if ventilation has been provided in an indoor location, the EVE may prompt the electrician to confirm that ventilation has started. Other tests that may be performed at 840 are the same as the tests performed at 830.

After all tests have been completed, the EVE may initiate a transition, 822 or 824 into State B and then the transition 812 to State A. The process 800 may then end at 895.

A test procedure may include more or fewer tests, and may perform tests in different order than the test procedure 800.

At any point during the process 800, errors could occur within the EVSE, such as those described in SAE J1772™ State E and State F. Errors may be indicated by the EVSE setting the control pilot contact to 0 volts or −12 volts DC. The EVE may be unable to take any action to initiate these States, since they are generated exclusively by the EVSE. The EVE may simple log the occurrence of an error and enter a "safe mode" when detecting either of these states. In particular, the EVE may isolate itself from the L1 and L2 pins upon detecting an error during a test sequence.

Figure 9:
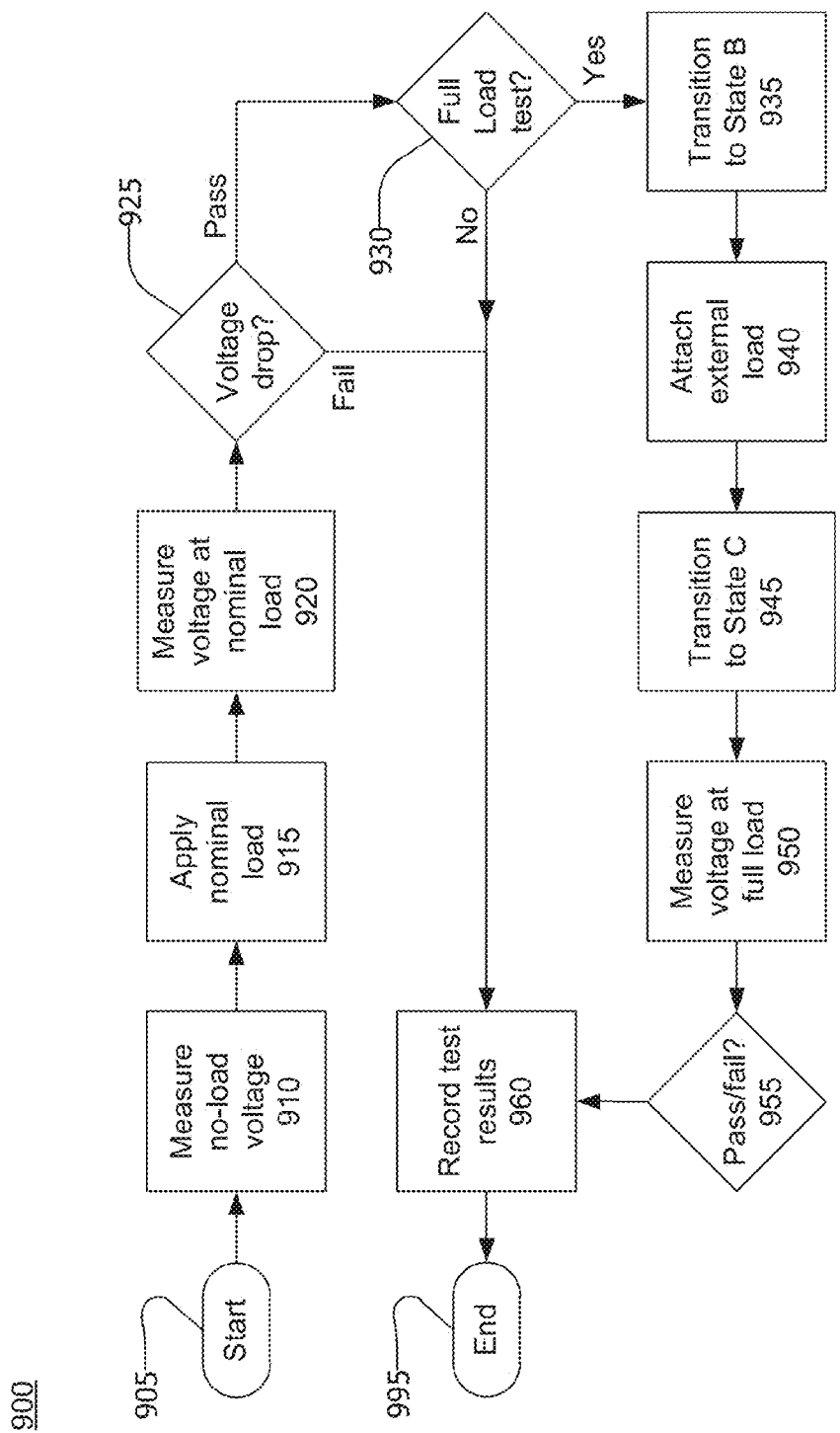
FIG. 9 is a flow chart of a load test.

Referring now to FIG. 9, an exemplary process 900 for conducting load tests may be suitable for conducting load tests as part of 830 in the process 800. The load test 900 may start at 905 when an EVE causes an EVSE under test to transition to State C as defined in SAE J1772™. At 910, the voltage output by the EVSE on the L1 and L2 contacts may be measured in the absence of any load on the L1 and L2 contacts. The no-load voltages output from the EVSE may be stored in a memory or otherwise recorded.

At 915, the EVE may apply a nominal load to the L1 and L2 contacts, which is to say the EVE may generate a current flow between the L1 and L2 contacts. The nominal load may be generated by a circuit such as the load generator 460. The nominal load may simply be a resistor or a bank of resistors connected between the L1 and L2 contacts. Since the energy drawn by the nominal load must be dissipated as heat within the EVE, the nominal load current may be only a fraction of the current available from the EVSE and/or may be drawn for only a small fraction of the ordinary charging time. At 920, the voltage output by the EVSE on the L1 and L2 contacts may be measured.

At 925, the no-load voltages measured at 910 and the nominal-load voltages measured at 920 may be compared or subtracted to determine a voltage drop due to the nominal load current. The voltage drop may be compared to a maximum allowable voltage drop, which may be specified, for example, by the manufacturer of the EVSE. If the voltage drop determined at 925 exceeds the maximum allowable voltage drop, the EVSE may be considered to fail the load test. A voltage drop in excess of the maximum allowable may indicate, for example, a defective connection between the EVSE and the utility grid, or a bad cable or connection between the EVSE and the EVE. If the EVSE fails the load test at 925, the test results from 910, 920, and 925 may be stored and/or reported at 960 and the process 900 may end at 995.

If the voltage drop determined at 925 is less than the maximum allowable voltage drop, a determination may be made at 930 whether or not a full load test will be performed. A full load test may be required, for example, by the manufacturer or the purchaser of the EVSE. A full load test may be performed at the option of the electrician. Since a full load current test can result in overheating of a defective connection, a full load test may be performed only if the voltage drop determined at 925 is less than the maximum allowable voltage drop. Additionally, a full load test may only be performed if a suitable external load is available. If a determination is made at 930 that a full load test will not be performed, the test results from 910, 920, and 925 may be recorded and reported at 960 and the process 900 may end at 995.

If a determination is made at 930 that a full load test will be performed, the EVSE may be set to State B at 935, allowing a suitable external load to be safely connected to the EVE at 940. The external load may include, for example, a bank of resistors that dissipate the full load current as heat and a cooling system, such as a fan, to distribute the heat into the atmosphere. After external load is connected to the EVE, the EVSE may be set to state C at 945. At 950, the voltage output by the EVSE on the L1 and L2 contacts may be measured. A pass/fail determination may be made at 955 based, for example, on the current actually provided by the EVSE during the full load test and the difference between the full-load voltage measured at 950 and the no-load voltage measured at 920. In either case, pass or fail, the test results from 910, 920, 925, and 950 may be recorded and reported at 960 and the process 900 may end at 995.

Another test that may be performed at 830 in the process 800 is a ground fault test. UL Standard 2231-2 and other standards that may apply to CCIDs require that the CCID must not trip for ground fault currents below a first defined current level and must trip within a defined maximum time period at a second defined ground fault current level. Further, the allowed time-to-trip is progressively shorter for ground fault current levels above the second defined current level. Simplistically, a process to test a CCID may apply a ground fault current at the second defined current level and measure the time until the CCID trips. The CCID may be considered to pass if the time-to-trip is less than or equal do the defined maximum time period. A more sophisticated CCID test process may apply an initial ground fault current, starting at a current level below the first defined current level, and then progressively increase the ground fault current level until the CCID trips. The CCID may be considered to pass the test if the current at which the CCID tripped is less than the second defined current level. However, neither of these processes fully characterizes the function of a CCID.

Figure 10:
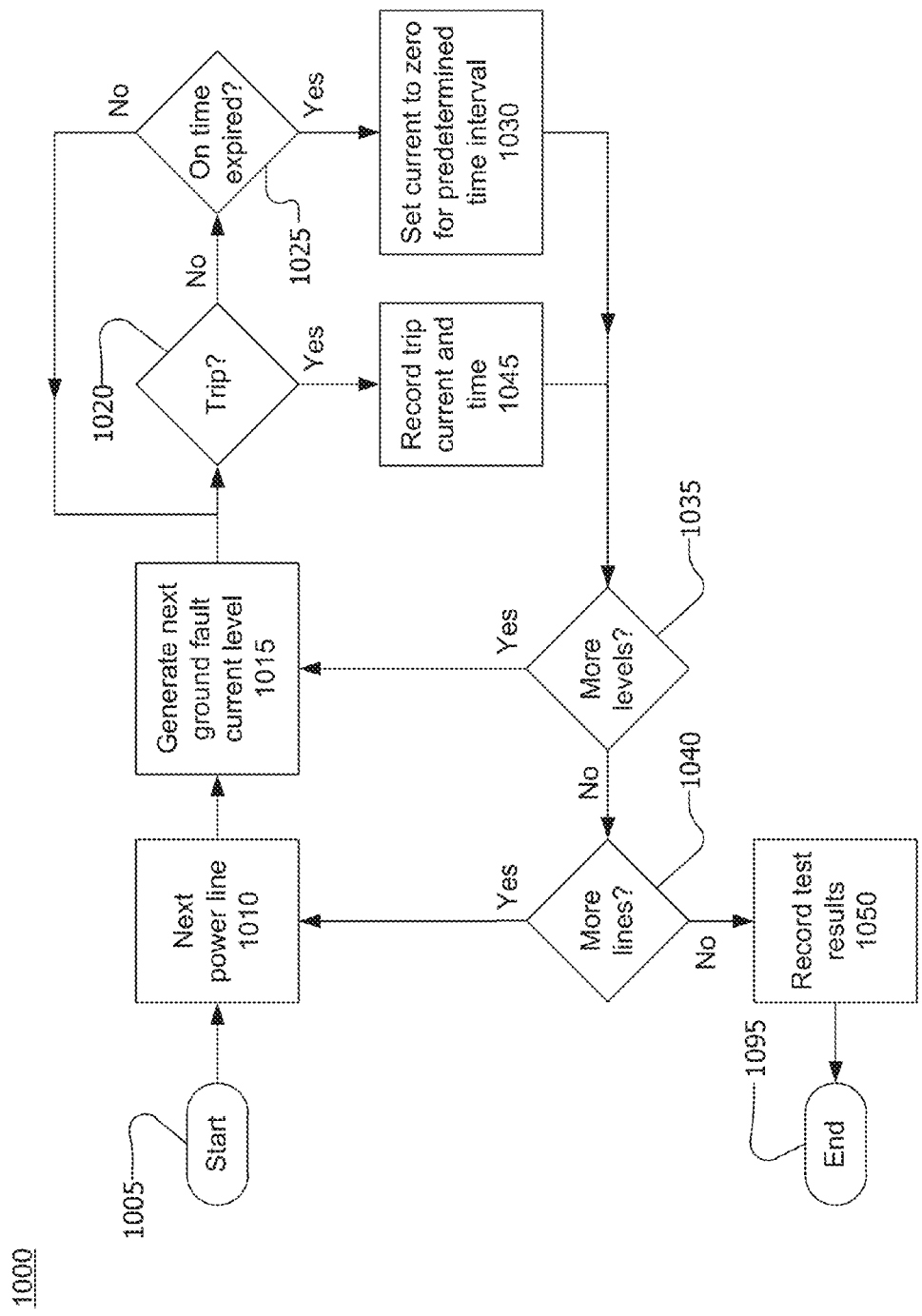
FIG. 10 is a flow chart of a ground fault test.

Referring now to FIG. 10, a ground fault test process 1000 may be suitable for use as part of 830 in the process 800. The process 1000 may be suitable to test that a CCID within an EVSE interrupts power flow to an EVE as required by UL Standard 2231-2 (or a comparable standard in other countries). The process 1000 may also be suitable to test the CCID does not erroneously interrupt charging power to the EVE at lower levels of ground fault current. The process 1000 may be suitable to test the CCID to more stringent standards than UL Standard 2231-2, as may be specified by the EVSE manufacturer.

The process 1000 may begin at 1005 when a ground fault interruption test is initiated manually or automatically as part of a stored test procedure. The process 1000 may end at 1095 after completion of the ground fault interruption test. The process 1000 tests the CCID by sequentially applying, to each power line, a ground fault current at a plurality of different current levels. The process 1000 determines, for each of the plurality of current levels, whether or not the CCID trips and, if the CCID trips, the time-to-trip. The plurality of current levels may include, for example, a level below the first defined current level (to verify that the CCID does not trip), several levels in the range from the first defined level to the second defined level (to determine a minimum trip level and to verify that the CCID trips within the required maximum time), and at least one level substantially higher than the second defined current level (to verify that the time-to-trip is shorter for a higher ground fault current).

At 1010, a first power line to be tested maybe selected. In the U.S., a Level 1 EVSE provides 120 volt single-phase power over two power lines, one of which is grounded. Thus a level 1 EVSE has only a single power line to test. A Level 2, 240 volt, EVSE provides power over two ungrounded power lines, each of which must be tested independently. A three-phase EVSE, as used in other countries, provides power over three ungrounded power lines. Ground fault interruption tests may be performed on all three power lines independently. Alternatively, independent tests may be performed on two of the three power lines, and a fault on the third power line may be simulated by shunting current to ground from both of the first two power lines simultaneously. Future high voltage DC chargers may provide power over two power lines, one of which may be grounded.

At 1015, a first current level may be selected from the plurality of current levels, and a corresponding ground fault current having the selected current level may be generated between the power line selected at 910 and ground. The first current level may be less than a current at which the CCID in the EVSE is required to interrupt power flow to the EVE.

At 1020, a determination may be made whether or not the CCID has "tripped", or interrupted power flow to the EVE. If the CCID has not tripped, a determination may be made at 1025 whether or not a predetermined "on-time" period associated with the selected current level has expired. On-time periods associated with each of the plurality of current levels may be the same or different. If the predetermined on-time period associated with the selected current level has not expired, the process may return to 1020. While shown as sequential actions for ease of explanation, the actions at 1020 and 1025 may be performed concurrently, with the result that the current generated at 1015 is sustained until either the CCID trips ("yes" at 1020) or the predetermined on-time period expires ("yes" at 1025).

If the CCID of the EVSE does not trip and the on-time period expires at 1025, the ground fault current may be set to zero at 1030 for predetermined time interval. The inventors have found that CCID devices have substantial hysteresis, or dependence upon prior conditions. For example, the time required for a CCID to trip after change in current from 15 milliamps to 20 milliamps may be substantially different than the time required for the CCID to trip after change in current from zero to 20 milliamps. Thus to ensure accurate time-to-trip measurements, the ground fault current may be set to zero at 1030 between each current step for a predetermined off-time period sufficient to "reset" the CCID. Each of the plurality of current levels may be associated with a respective off-time period. The off-time periods associated with the plurality of current levels may be the same or different. Each predetermined off-time period may be, for example, from one to three seconds.

After the ground fault current has been held at zero for the predetermined off-time period at 1030, a determination may be made at 1035 whether or not there are more current levels in the plurality of current levels, which is to say whether or not the CCID should be tested at a different current level. When a determination is made that the CCID should be tested again at a different current level, the process 1040 may repeat from 1015 using a new ground fault current level. The plurality of current levels may be selected, for example, in order of increasing current.

When a determination is made at 1035 that the CCID has been tested at all of the plurality of predetermined current levels (No at 1035) a further determination may be made at 1040 whether or not another power line should be tested. When all power lines have been tested (No at 1040) test results may be recorded and reported at 1050 and the process may end at 1095. When a determination is made at 1040 that another power line should be tested, the process 900 may repeat from 1010, selecting a different power line and starting at the first current level at 1015.

Figure 11:
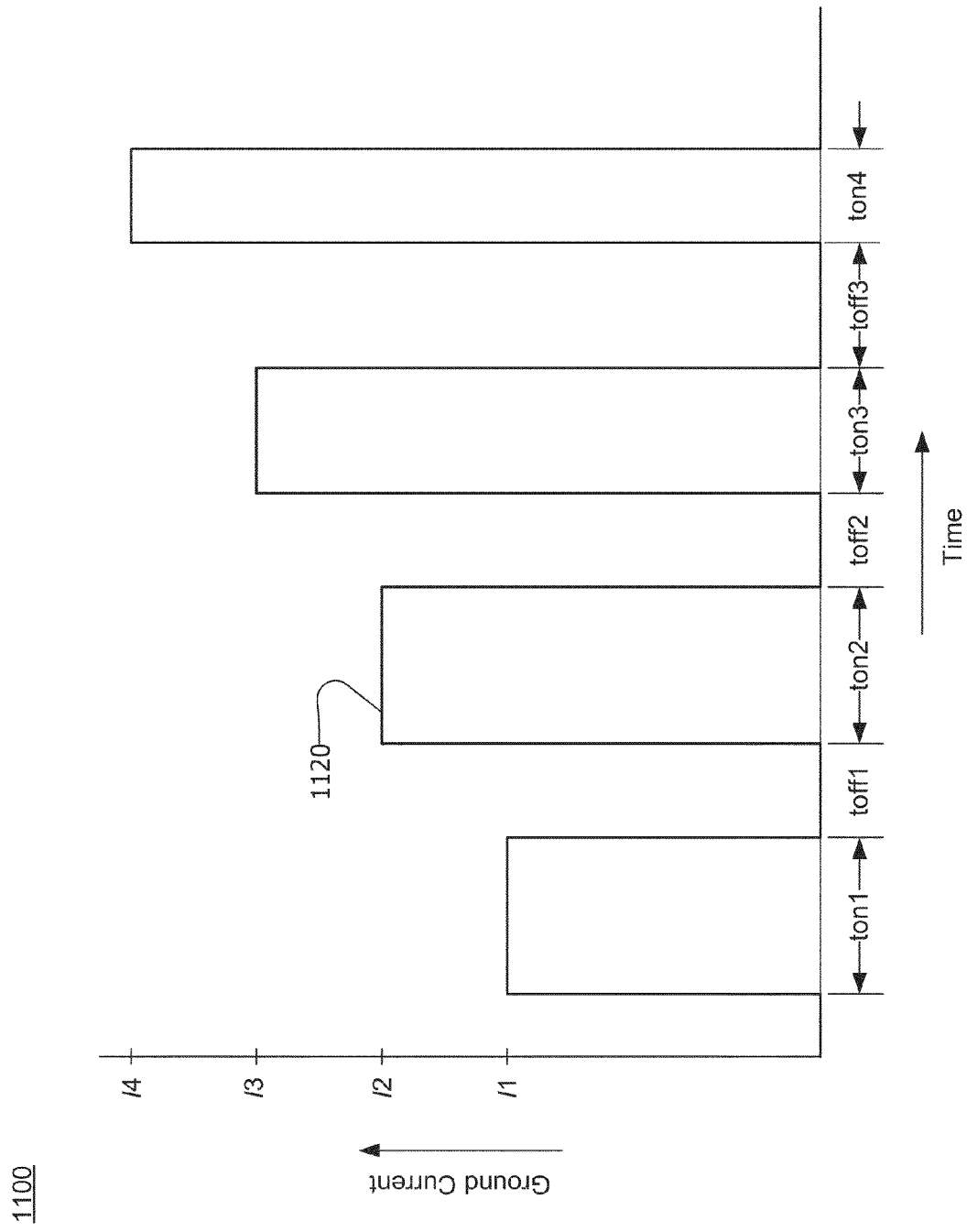
FIG. 11 is a graph of ground current during a ground fault test.

FIG. 11 is a graph plotting ground fault current 1120 versus time. The ground fault current 1120 is exemplary of the current that may flow between a power line and ground during a ground fault test such as the ground fault test 1000. The ground fault current may be generated at a plurality of current levels I1, I2, I3, I4. While the chart 100 illustrates four current levels, more or fewer than four current levels may be used during a ground fault test. Each current level may be generated for a respective time on-time period ton1, ton2, ton3, ton4. The on-time periods may be the same or different. The on-time periods for lower current levels (where the test objective is to confirm that a ground fault protection circuit does not trip) may be longer than the on-time periods for higher current levels (where the test objective is to verify that the ground fault protection circuit trips within a specified time period). The current 1120 may be set to zero for off-time periods toff1, toff2, toff3 between each on-time period. The off-time periods may be the same or different.

Referring back to 1020 in FIG. 10, when a determination is made that the CCID has tripped (by the absence of the charging voltage at the L1 and L2 contacts), the current level and the time-to-trip may be recorded at 1045. The test may then continue from 1030 as previously described. However, SAE J1772™ requires that an EVSE wait at 30 minutes before automatically resetting a tripped CCID. Thus, to allow the process 1000 to continue within a reasonable time period, the EVSE under test must have provisions to reset the CCID more quickly during test. For example, the EVSE may have a provision for the electrician to reset the CCID manually after each trip.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A process for performing a ground fault test of a device that delivers power to a load via one or more power lines, the process comprising:
programming a controller to execute, or cause to be executed, the process steps:
selecting a current level of a controllable current generator from a plurality of different current levels;
generating a ground fault current with the controllable current generator between a first power line of the one or more power lines and ground at the selected current level until a ground fault interrupter within the device trips in response to the ground fault current, or until expiration of an on-time interval associated with the selected current level, whichever occurs first;
after generating the ground fault current at the selected current level, setting the ground fault current to zero for an off-time interval associated with the selected current level, and repeating the selecting, generating, and setting for each of the plurality of current levels, wherein:
when the ground fault interrupter within the device trips, the process further comprises:
reporting the selected current level at which the ground fault interrupter tripped, and a time interval from an onset of the ground fault current at the selected level, and a time when the ground fault interrupter tripped.

2. The process of claim 1, wherein
the one or more power lines is a plurality of power lines, and
the process further comprises performing the selecting, generating, setting, repeating, and reporting for one or more power lines other than the first power line.

3. The process of claim 1 wherein:
the plurality of current levels includes at least one current level less than a specified minimum trip current of the ground fault interrupter and at least one current level greater than the minimum trip current.

4. The process of claim 1, wherein at least one of the on-time intervals associated with the plurality of current levels is different from the others.

5. The process of claim 1, wherein at least one of the off-time intervals associated with the plurality of current levels is different from the others.

6. An apparatus for performing a ground fault test of a device that derivers power to a load via one or more power lines, the apparatus comprising:
a first controllable current generator connected to generate a first ground fault current between ground and a first power line of the one or more power lines; and
a controller coupled to the first controllable current generator, wherein the controller is programmed to perform or cause to be performed, the following actions:
selecting a current level sourced by the first controllable current generator, from a plurality of different current levels;
controlling the first controllable current generator to generate a ground fault current at the selected current level until a ground fault interrupter within the device trips in response to the ground fault current, or until expiration of an on-time interval associated with the selected current level, whichever occurs first;
after controlling the first controllable current generator to generate a ground fault current at the selected current level, controlling the first controllable current generator to set the ground fault current to zero for an off-time interval associated with the selected current level, and repeating the selecting and controlling actions for each of the plurality of current levels, wherein:
the controller is further programmed to perform, or cause to be performed, the following actions:
when the ground fault interrupter within the device trips, reporting the selected current level at which the ground fault interrupter tripped, and a time interval from an onset of the ground fault current at the selected level, and a time when the ground fault interrupter tripped.

7. The apparatus of claim 6 wherein:
the plurality of current levels include at least one current level less than a specified minimum trip current of the ground fault interrupter and at least one current level greater than the minimum trip current.

8. The apparatus of claim 6, wherein one of the on-time intervals associated with the plurality of current levels is different from the others.

9. The apparatus of claim 6 wherein at least one of the off-time intervals associated with the plurality of current levels is different from the others.

10. The apparatus of claim 6, wherein the controller further comprises:
a processor;
non-transitory storage coupled to the processor, the non-transitory storage storing instructions that, when executed by the processor, cause the controller to perform the selecting, controlling repeating, and reporting actions.

11. The apparatus of claim 6, further comprising:
a second controllable current generator connected to generate a second ground fault current between ground and a second power line of the plurality of power lines, wherein the controller is coupled to the second controllable current generator and configured to perform actions including:
selecting a current level sourced by the second controllable current generator, from a plurality of different current levels;
controlling the second controllable current generator to generate a ground fault current at the selected current level until a ground fault interrupter within the device trips in response to the ground fault current, or until expiration of the on-time period associated with the selected current level, whichever occurs first;
after controlling the second controllable current generator to generate a ground fault current at the selected current level, controlling the second controllable current generator to set the ground fault current to zero for the off-time interval associated with the selected current level, and repeating the selecting and controlling actions for each of the plurality of current levels, wherein:

the controller is further programmed to perform, or cause to be performed, the following actions:

when the ground fault interrupter within the device trips, reporting the selected current level at which the ground fault interrupter tripped, and a time interval from an onset of the ground fault current at the selected level, and a time when the ground fault interrupter tripped.

* * * * *